United States Patent [19]

Bajka et al.

[11] Patent Number: 4,703,714
[45] Date of Patent: Nov. 3, 1987

[54] APPARATUS FOR REMOVING SOLDER FROM THE DRILL HOLES OF EMPTY PRINTED CIRCUIT BOARDS COATED WITH SOLDER

[75] Inventors: Imre Bajka, Niederglatt; Robert Furrer, Lucerne, both of Switzerland

[73] Assignee: Siemens-Albis AG, Zürich, Switzerland

[21] Appl. No.: 669,948

[22] Filed: Nov. 9, 1984

Related U.S. Application Data

[63] Continuation-in-part of Ser. No. 365,642, Apr. 5, 1982, Pat. No. 4,501,770.

[30] Foreign Application Priority Data

Apr. 15, 1981 [CH] Switzerland .................. 2512/81

[51] Int. Cl.⁴ ........................................... B05C 11/08
[52] U.S. Cl. ........................................ 118/57; 118/641
[58] Field of Search .................. 73/12; 118/57, 641; 427/347

[56] References Cited

U.S. PATENT DOCUMENTS

| | | | |
|---|---|---|---|
| 1,397,175 | 11/1921 | Mowry | 427/347 |
| 2,267,273 | 12/1941 | Garbe | 118/57 X |
| 3,226,974 | 1/1966 | Bresk et al. | 73/12 |
| 4,129,668 | 12/1978 | Rouquié | 118/57 X |

FOREIGN PATENT DOCUMENTS 219503 5/1957 Australia .

Primary Examiner—Evan K. Lawrence

[57] ABSTRACT

During the pre-soldering or tinning of printed circuit boards, as a rule, also the drill holes or bores and, in particular, the through-metallized drill holes are filled in an undesirable manner with solder. This solder must be removed before mounting the electrical components or elements upon the printed circuit boards. A simple apparatus is disclosed for this purpose, affording a faultless de-soldering of the drill holes, without deleteriously affecting the properties of the solder material. The printed circuit boards, in a condition where the solder applied during the pre-soldering operation is still molten, are accelerated at least once and thereafter suddenly brought to standstill in such a fashion that the excess solder is knocked or propelled out of the drill holes. The apparatus serves to guide the printed circuit board essentially horizontally in a frame and to accelerate such printed circuit board in a guided vertical drop or fall in the direction of an impact location, so that upon concussion of the frame at the impact location the excess solder is downwardly knocked or propelled out.

9 Claims, 7 Drawing Figures

Fig. 1
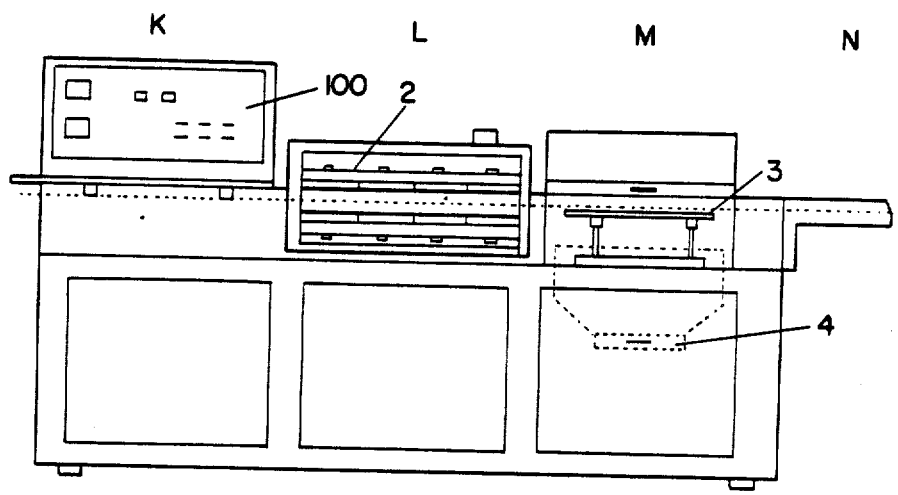
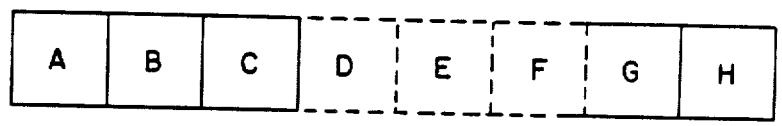
Fig. 3

APPARATUS FOR REMOVING SOLDER FROM THE DRILL HOLES OF EMPTY PRINTED CIRCUIT BOARDS COATED WITH SOLDER

CROSS REFERENCE TO RELATED APPLICATION

This application is a continuation-in-part of our commonly assigned, copending U.S. application Ser. No. 06/365,642, filed Apr. 5, 1982, now U.S. Pat. No. 4,501,770, granted Feb. 26, 1985.

BACKGROUND OF THE INVENTION

The present invention relates to a new and improved apparatus for removing solder from the drill holes or boares of component-free printed circuit boards tinned or coated with solder.

During the production of printed circuit boards for printed circuits there is frequently applied, as a final step in the fabrication process, a protective solderable coating to the printed circuit boards so that, among other things, there can be improved their storage retention properties or shelf life. The possibility exists of tinning or coating the conductor tracks of the printed circuit boards in accordance with one of the state-of-the-art methods, such as immersion tinning, splash bath tinning and so forth, with a solder layer of a predetermined thickness. As a general rule, however, when performing these solder-coating or tinning methods, the drill holes or the like and, in particular, the through-metallized holes of the printed circuit boards are also filled with solder which, at the latest, must be removed prior to mounting the electrical components or elements in the printed circuit boards. Under the expression "solder or tinning" as used in the context of this disclosure there are to be understood all those solder alloys which can be conventionally employed during the tinning or soldering of printed circuit boards. Equally, at times in this disclosure reference may be made to "de-tinning" and such term is to be used in its broader sense as encompassing not only the removal of solder containing tin but other types of solders which might be beneficially employed in conjunction with printed circuit boards.

To free the drill holes from excess solder there have become known to the art different methods and apparatuses. Thus, for instance, there has been proposed a so-called solder centrifuge which receives a printed circuit board coated with a flux agent, immerses such in a vat or receptacle containing molten solder and after removal therefrom rotates the plate or printed circuit board in such a manner that the excess solder is removed from the holes by action of the centrifugal force. Such type of equipment requires an appreciable mechanical expenditure.

A further method known to the art has been designated as the so-called hot air solder leveling process. Significant in this regard is the publication "Proceedings of the First Printed Circuit World Convention", Volume 2, June 5-8, 1978, the article by D. Schoenthaler, entitled "Solder Coating Thickness Considerations for Hot Gas Solder Leveling", pages 2.4.1 to 2.4.8. With this technique the printed circuit boards or plates are attached in a holder, immersed in a molten solder bath and directly after removal therefrom brought into contact on both sides or faces with hot compressed air, so that here, too, the drill holes are freed of excess solder.

Practical experience has shown, however, that this technique is not devoid of problems. With this method, as far as the resultant solder layer thickness in the drill holes is concerned, determining factors, apart from the solder composition, the solder bath temperature, the residence time in the solder bath and the withdrawal speed, are the angle of the hot air nozzles with respect to the plane of the printed circuit boards, their spacing from the printed circuit boards as well as the pressure and temperature of the hot air. In particular, the optimum setting of the last four-mentioned parameters can be particularly difficult and quite different depending upon the type of printed circuit board which is being processed. Also, with this state-of-the-art method the danger exists that the drill holes will be freed of solder at their edge regions to a greater extent than permissible by the action of the compressed air and at these locations undesirable oxidation of the conductor material will occur. Furthermore, during the blowing-out operation there must be expected an uncontrolled shower of solder spatters which, for instance, could undesirably resettle in the drill holes. Furthermore, with such prior art equipment measures must be provided for removal of the noxious metallic vapors which circulate during the fluxing operation. Thus, on balance, an apparatus operating according to this state-of-the-art method requires a relatively large amount of space and equipment expenditure, so that it is not readily possible to incorporate such equipment in an extensively automated production line. The mere requirement of providing a source of hot compressed air and the corresponding higher energy consumption, renders questionable, under many circumstances, the economically justifiable employment of such method.

SUMMARY OF THE INVENTION

Therefore, with the foregoing in mind, it is a primary object of the present invention to provide a new and improved apparatus for the removal of solder from the drill holes of component-free or component-less or base printed circuit boards tinned or coated with solder, in a manner not afflicted with the aforementioned drawbacks and limitations of the prior proposals.

Another and more specific object of the present invention aims at the provision of a new and improved apparatus for the removal of solder from undesired locations of printed circuit boards or the like without encountering the aforementioned difficulties and which renders possible in a most simple fashion a relatively faultless freeing of the drill holes from excess solder without impairment the properties of the solder.

Still a further significant object of the present invention aims at providing a new and improved construction of apparatus for removing solder from printed circuit boards, in other words de-tinning or de-soldering such printed circuit boards, in an extremely reliable, efficient and economical fashion.

Yet a further significant object of the present invention is directed to a new and improved construction of apparatus for the removal of solder from the drill holes of printed circuit boards, which apparatus is relatively simple in construction and design, economical to manufacture, extremely reliable in operation, not readily subject to breakdown or malfunction, and requires a minimum of maintenance and servicing.

Now in order to implement these and still further objects of the invention, which will become more readily apparent as the description proceeds, there is provided according to one constructional manifestation of such solder-removal apparatus, a frame containing means for the reception of at least one printed circuit board which can be randomly displaced along a guide arrangement and subjected to an acceleration relative to an impact location.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 1 schematically illustrates the essential components or units of a solder-removal apparatus constructed according to the invention;

FIG. 3 illustrates a general flow diagram which can be used at a complete solder-applying and de-soldering installation;

DETAILED DESCRIPTION OF THE PREFERRED EMBODIMENTS

Figure 2:
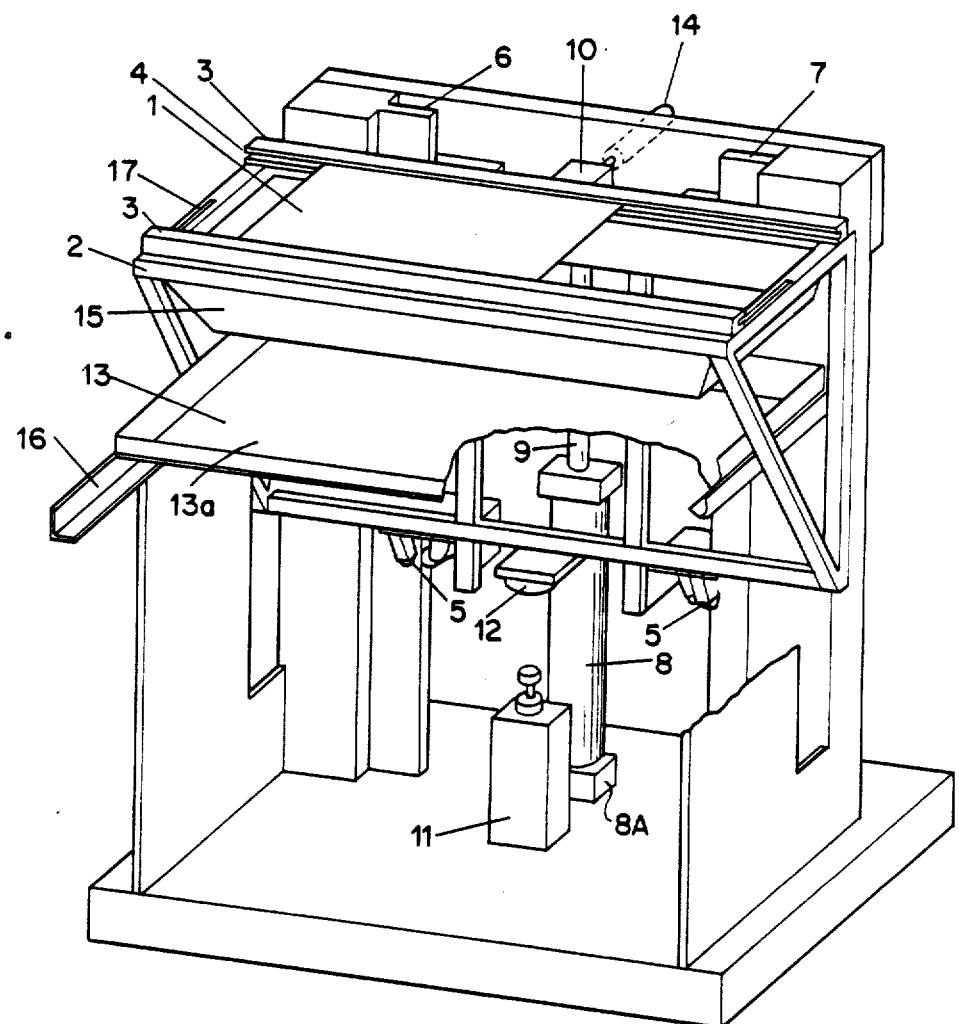
FIG. 2 is a perspective view illustrating details of the apparatus arrangement of FIG. 1, where the drill holes of the pre-soldered or pre-tinned printed circuit boards are freed of excess solder.

Describing now the drawings, it is to be understood that only enough of the construction of the various embodiments of solder-removal apparatus disclosed herein, by way of example and not limitation, has been shown in the drawings as will enable those skilled in the art to readily understand the underlying principles and concepts of the present development, while simplifying the illustration of the drawings. Turning attention now to the embodiment of solder-removal apparatus depicted in FIG. 1, such will be seen to contain four stations, namely a preparatory station K, a heating station L, a de-soldering station M and a delivery or outfeed station N. Such apparatus or installation serves for processing already tinned or pre-soldered printed circuit boards, and the processing thereof encompasses removing excess solder from the drill holes or the like of such printed circuit boards, in order to prepare the thus processed printed circuit boards so that there subsequently can be mounted thereat the intended electrical components or elements. The pre-soldering or pre-tinning of the printed circuit boards is accomplished in any conventional fashion and, therefore, need not be here further explained, for instance by immersion tinning or soldering or splash bath tinning or soldering techniques.

The pre-soldered printed circuit boards, after having been brought into contact with a suitable flux or fluxing agent, are fed into the preparatory station K, from which location they automatically cyclically travel in a substantially horizontal position through the apparatus, in a predetermined cycle time, until reaching the delivery station N. The cycle times, as well as other parameters which are relevant for the course of the processing operation, can be conveniently set at any suitable control device 100. A printed circuit board 1 which has been delivered to the preparatory station K initially is placed at that location in a waiting or hold position. As soon as the working cycle permits, the printed circuit board is then transferred, at a proper point in the cycle time, to a transport system travelling along the broken horizontal line shown in FIG. 1 through the equipment and transferred to the heating station L. This heating station L contains, for instance, a heatable closed chamber. There can be conveniently provided as the thermal energy source infrared radiating devices 2 which irradiate the inserted printed circuit board 1 from below and/or from above over its entire surface. The temperature at the heating station L can be randomly adjusted or set, and the spacing of the infrared radiating devices 2 from the surface of the printed circuit boards can likewise be altered, as desired. Of course, other known techniques can be used for melting or remelting the solder upon the printed circuit boards, such as, for instance, immersion of the printed circuit boards in a solder oil or in a molten solder bath and so forth. As soon as, following a certain residence time, a printed circuit board has attained the solder melt temperature, then such printed circuit board is displaced into the de-soldering station M for the purpose of removing the fluid solder out of the drill holes of such printed circuit board. The de-soldering station M essentially comprises a displaceable holder or support arrangement 3 for the printed circuit board and a vat or container 4 located therebelow.

FIG. 2 illustrates details of the de-soldering station M to the extent that such are of significance for the inventive apparatus. The printed circuit board 1 is displaced from the heating station L onto a guided frame or frame member 2 containing two essentially parallel holder rails 3. These holder rails 3 are each equipped with a groove or channel 4 in which there can be horizontally guided the printed circuit board 1. One of the holder rails 3 is rigidly connected with the frame 2, whereas the other holder rail 3 is parallelly displaceable, so that there can be conveniently introduced and handled printed circuit boards 1 of different dimensions. To that end, there are provided at both parts of the frame 2 which extend perpendicular to the holder rails 3 slots 17 into which engage releasable attachment or fixation means which are mounted at the displaceable holder rail, these attachment means not being particularly shown in the drawings. Additionally, the holder rails 3 are advantageously appropriately constructed such that the width of the groove or channel 4 can be freely adjusted, and thus, can be accommodated to printed circuit boards 1 of different thickness.

At the frame or frame means 2 there are also provided four sets of guide rolls 5, each set of guide rolls 5 containing three guide rolls. In the drawings only the two lowermost guide rolls are visible. In each instance two sets of guide rolls 5 are guided upon a related guide rail 6 and 7, respectively, extending vertically with regard to the plane of the printed circuit board 1. The rails or rail members 6 and 7 extend substantially to one another and are rigidly connected with a carrier or frame of the de-soldering station M, see FIG. 1. Consequently, the entire guided frame 2 is vertically displaceable along the rails or rail members 6 and 7.

The movement of the frame member or frame 2 is accomplished by means of a displacement or lift cylinder 8 or equivalent structure. For this purpose the frame 2 bears against a support or abutment 10 on a piston extension 9 of the displacement cylinder 8. Furthermore, there is provided a damping element 11, defining an impact location, upon which the frame 2 bears by means of a stop of impact member 12 after reaching its lowermost position. At the frame 2 there is arranged a vat or container 13 which can be conveniently retracted upon the rails 16. This vat or container 13 extends at least over the entire surface of the printed circuit board 1 in such a manner that solder dropping off of the printed circuit board 1 can directly fall into the collecting vat or container 13. A collar 15 or equivalent structure having slightly inwardly inclined side surfaces facilitates the reception of the dropping solder at the vat or container 13.

Treatment of a printed circuit board 1 which has arrived at such de-soldering station M is accomplished in the following manner: The frame 2 is located in its uppermost position upon arrival of the printed circuit board 1 and is retained at that location by the not particularly referenced piston of a further cylinder unit 14. This piston engages the support or abutment 10. On the other hand, the piston extension 9 of the displacement cylinder 8 is in its lower starting position. As soon as the printed circuit board 1 arriving from the heating station L has been completely inserted into the holder rails 3, then the arrestation of the frame 2 is released by appropriately actuating the cylinder unit 14. This, in turn, causes a vertical drop of the frame 2 together with the printed circuit board 1. The frame 2 impacts by means of its stop or impact member 12 upon the damping element 11 and is braked. Consequently, the excess solder located in the drill holes of the printed circuit board 1 is propelled or knocked-out downwardly through the drill holes and collected in the collecting vat or container 13. Removal of the solder from the drill holes is possible because, by virtue of the heating operation occurring at the heating station L, the solder is still in a fluid or molten condition. Thereafter, the frame 2 is again raised into its starting position by the action of the displacement or lift cylinder 8. The printed circuit board 1 which has now been freed of the excess solder is thereafter, following cooling to a temperature where the solder remaining on the printed circuit board 1 solidifies, transferred into the delivery or outfeed station N, see FIG. 1, from which location it then undergoes a conventional, and therefore not further described, cleaning process. The frame or frame member 2 is then ready for receiving a new printed circuit board 1 from the heating station L.

Practical applications have shown that when performing the described procedures there can be obtained faultless printed circuit boards. The thickness of the solder layer at the critical locations at the region of the drill holes and, in particular, the drill hole-edges, satisfies high requirements. The apparatus shown in FIG. 2 for the de-soldering of the printed circuit boards can be incorporated without difficulty into a fully automated production line. It does not require any appreciable expenditure in operator time and it can be very simply and quickly adapted to different sizes of printed circuit boards. Of course, other constructions of equipment can be devised which are suitable for achieving the operational features of the inventive apparatus and which are accommodated to the particular features of the encountered production line. The actuation of both cylinders can be accomplished by means of a conventional freely programmable control.

The vat or container 13 need not absolutely be connected with the frame 2. A vat also could be arranged independently beneath the frame 2 at the region of fall or drop region D of the printed circuit board 1. However, practical experience has demonstrated that there can be obtained an improvement as concerns the quality of the de-soldered drill holes if the vat or container 13, as described, is connected with the frame 2 and, consequently, participates in the drop or fall movement of the printed circuit board 1. The base or floor surface of the container 13 is located at a certain distance parallel to the surface of the printed circuit board and preferably is covered with a suitable material, for instance a metal sponge, which absorbs as completely as possible the impact energy of the downwardly propelled solder particles. With such type of arrangement there is disposed immediately below the printed circuit board 1 a space containing stationary air which is moved upon acceleration of the printed circuit board 1. In comparison to an arrangement having an independent vat or container 13 the printed circuit board 1, therefore, during its dropping movement, is exposed to an appreciably smaller air flow from below, so that it tends to cool off less rapidly. Hence, the drill holes are more uniformly de-soldered.

Figure 6:
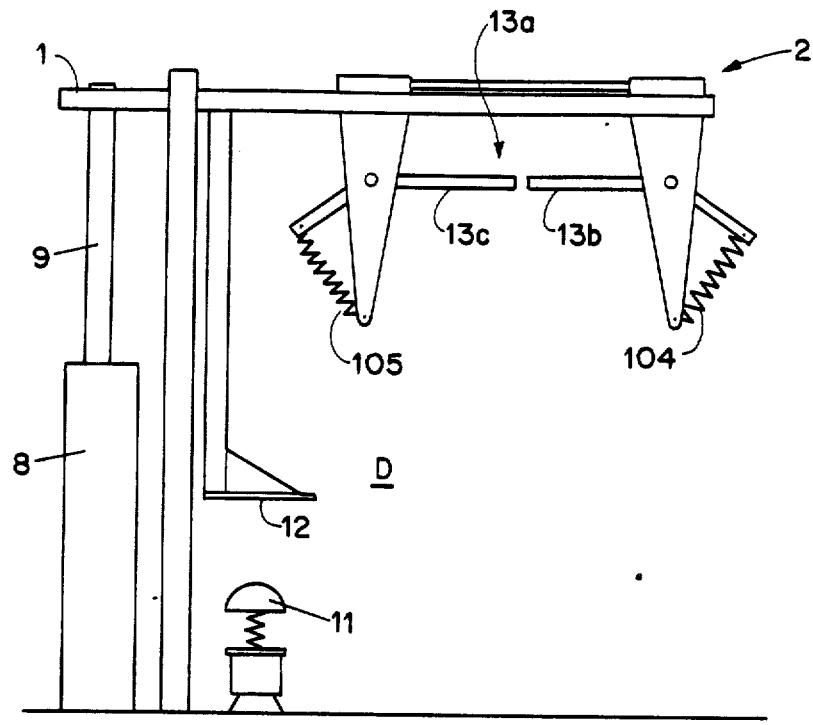
FIG. 6 is a schematic illustration of a modified embodiment of the inventive solder-removal apparatus shown in FIG. 2 and containing a vat with a subdivided floor in its closed state.
Figure 7:
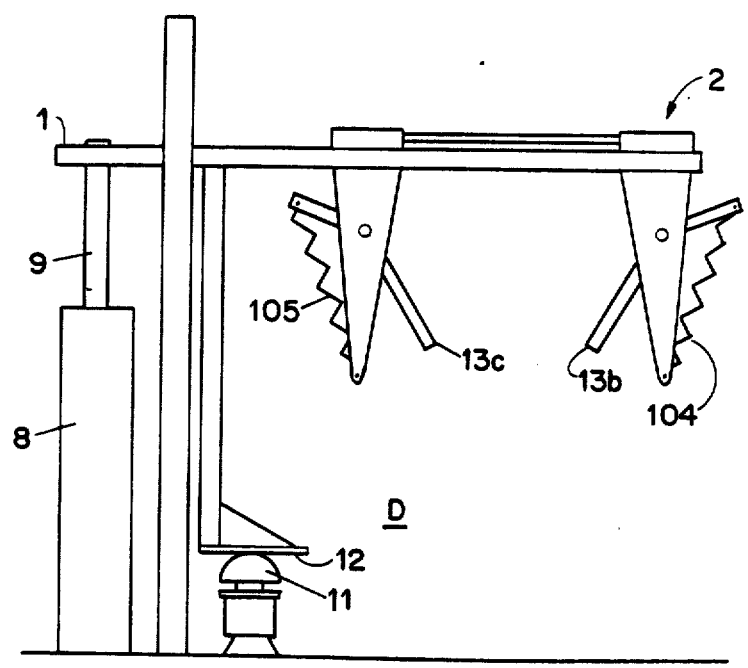
FIG. 7 is a schematic illustration of the solder-removal apparatus shown in FIG. 6 and with the subdivided floor in an open state.

A further improvement is obtained if the floor 13a of the vat or container 13 which is rigidly connected with the frame 2 is constructed of multiple parts or elements in such a manner that, upon impact of the frame 2, it downwardly opens and only again recloses following the impact. The container floor 13a can be, for instance, subdivided into two floor halves 13b and 13c in its lengthwise direction (see FIGS. 6 and 7), these floor halves 13b and 13c being downwardly deflected in the manner of a swinging door composed of two door wings or vanes following impact of the frame 2, and thereafter again being brought by the action of restoring springs 104 and 105 or equivalent structure into their starting position forming the closed container floor 13a or base. Upon opening of the container floor 13a there is formed a suction action in the space beneath the printed circuit board 1, this suction action further enhancing the de-soldering operation. Additionally, the excess solder is not actually caught in the vat or container 13, rather it leaves therefrom through the open container floor, and thus prevents any respattering of solder particles.

In practice, the situation can arise that the one-time "knocking" of the printed circuit board is not always adequate to produce an optimum result as far as the solder layer at the region of the drill holes of the printed circuit board is concerned. Then, it is advantageous to subject the printed circuit board to a number of accelerations and impact operations in direct succession.

With a dual or double acceleration of the printed circuit boards it has been found to be advantageous if the first drop or fall path is selected to be shorter than the second drop or fall path. In this manner, the beneficial result is achieved that during the first impact operation, with lesser energy, there is already removed a relatively large quantity of the solder out of the drill holes. During the second impact operation from a greater height there is then only knocked out or removed a smaller quantity of solder, and particularly in the case of printed circuit boards which have been laminated at both faces, the solder spatters which possibly still egress, especially counter to the direction of movement of the printed circuit board, i.e. in upward direction, are then so small in number and size that they subsequently can be readily removed during a following cleaning process.

A second "knocking" of the printed circuit board 1 can be realized relatively simply by appropriately by control means 8A controlling the displacement or lift cylinder 8. As soon as the printed circuit board 1 has been inserted in the uppermost position of the frame 2 which is supported upon the piston extension 9, the piston is continuously downwardly moved until there has been attained the desired drop height for the first knocking operation. Thereafter, the piston is suddently brought into its lower starting position using control means 8A, so that the frame 2 experiences a downward acceleration in a guided free fall until it impacts against the damping element 11. Thereafter, the frame 2, by appropriately actuating the displacement or lift cylinder 8, again is raised to a desired second fall or drop height —which, as explained preferably is larger than the first fall height—and then in the same manner undergoes another free fall. In order to realize the second or even further knocking operations at the printed circuit board 1 there is only required an appropriate control of the displacement cylinder 8, something which is readily possible by means of a suitable programmable control without any appreciable difficulties.

In contrast to the embodiment described with reference to FIG. 2, where the printed circuit board 1 is accelerated in a free fall, the printed circuit board 1 can also be accelerated while in a controlled vertical drop or fall. For this purpose there is required a special control of the displacement cylinder 8 in that, its piston is moved at a predetermined acceleration downwardly and, consequently, the frame 2, bearing upon the piston extension 9 during the entire movement course, along with the printed circuit board 1, experiences a corresponding downward acceleration. The requisite acceleration values, in the first instance, are dependent upon the configuration of the printed circuit board as well as upon the quantity of excess solder which is to be knocked-out in each case. Therefore, the determination of such values is best accomplished empirically.

In the previous description of the invention, it has been assumed that the metallized regions of the printed circuit boards which are to be freed of solder were already coated with solder and such arrived in a cold condition at the de-soldering station. The inventive apparatus for removing the excess solder can be, however, also advantageously employed in those instances where the printed circuit boards, in one continuous sequence, are covered or tinned with solder and directly thereafter, i.e. without any intermediate cooling, freed of excess solder. For purposes of more fully explaining this field of application or scheme there have been schematically illustrated in FIG. 3 the process steps in a fabrication or production line for the application of solder and the de-soldering of printed circuit boards. If the soldering and de-soldering is not accomplished in one sequence, but instead in two separate procedures, then there result the following individual phases: In the soldering operation the printed circuit boards are covered with a flux agent during a phase A, pre-heated during a phase B, and have solder applied to one or both sides or faces during a phase C. In the subsequent de-soldering operation, which can be carried out at a random point in time following the soldering operation, the printed circuit boards, during a phase D, are again covered with a flux agent, held in a preparatory state during a phase E, heated to a temperature which melts the solder during a phase F, freed in accordance with the inventive method of excess solder during a phase G and, finally, during a phase H delivered for further processing.

If the soldering and de-soldering operations are to be accomplished throughout an uninterrupted procedure without any intermediate cooling of the printed circuit board, then there are dispensed with the aforementioned phases D, E and F during the de-soldering operation. The printed circuit board need not be reheated prior to the de-soldering operation, since it is directly infed after the soldering operation, with the solder still liquid or fluid, to the de-soldering station and at that location freed of the excess solder. In this case there is only required part of the de-soldering apparatus of FIG. 1, namely the de-soldering station M and the outfeed or delivery station N, which correspond to the phases G and H in the flow diagram of FIG. 3.

The use of the described principle for de-soldering printed circuit boards is not limited in any way to the previously described embodiment employing a vertical drop of the printed circuit board while in a horizontal position. The basic concept of the apparatus of this development, namely the de-soldering by "knocking-out" of the excess solder, can be employed in further variant embodiments. Thus, in FIG. 4 there has been shown a possible variant embodiment in two side views, wherein the printed circuit board is mounted at a frame or frame means 70 and the pre-soldering of the printed circuit boards 1 or the melting of the solder of already pre-soldered printed circuit boards 1 is accomplished by vertical immersion in an immersion-type molten solder bath 20.

The printed circuit board 1 is first covered with a flux agent in a flux agent applicator 50 and can further be pre-heated in a heating station 60 prior to the immersion into the molten solder bath 20. The frame or frame means 70 including the printed circuit board 1 is operatively connected to accelerating means 80 which vertically withdraw the frame or frame means 70 including the printed circuit board 1 from the molten solder bath 20. During this withdrawal operation the frame or frame means 70 including the printed circuit board 1 is accelerated in a first or upward direction relative to a first impact location constituted by a stop or impact member 30. The first or upward direction of acceleration extends substantially perpendicularly to the axes of the drill holes in the printed circuit board 1. After withdrawal from the molten solder bath 20 the printed circuit board 1 contains excess molten solder. When the frame or frame means 70 including the printed circuit board 1 hits the stop or impact member 30, initially the excess molten solder flowing downwardly along the surface of the printed circuit board 1 is knocked-out into the molten solder bath 20. Thereafter, the frame or frame means 70 including the printed circuit board 1 is operated upon by further accelerating means 81 and accelerated relative to a further impact member 41 at a further impact location 40 in a second direction substantially perpendicular to the first or upward direction and substantially parallel to the axes of the drill holes in the printed circuit board 1. The further impact member 41 is arranged transversely of the stop or impact member 30 at the first impact location and upon impact of the frame or frame means 70 at the further impact member 41 the drill holes in the printed circuit board 1 are now substantially completely freed of excess molten solder. Directly thereafter the printed circuit board 1 is brought into its horizontal position, so that upon cooling of the printed circuit board 1 there is obtained a uniform solder distribution, especially at the region of the solder eyelets surrounding the drill holes. Of course, to the extent needed in this modified embodiment, it is readily possible to provide multiple accelerations of the printed circuit board in vertical and/or in horizontal direction.

Figure 5:
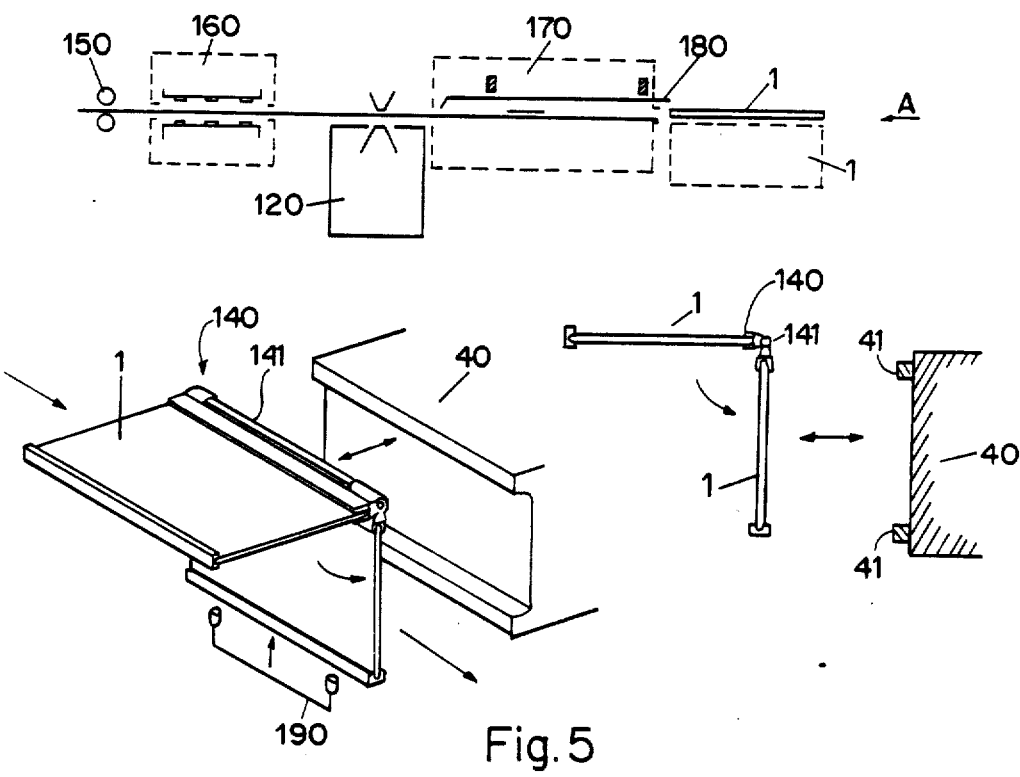
FIG. 5 illustrates a still further embodiment of the inventive apparatus.

A further embodiment of the apparatus, wherein the or tinning of the printed circuit boards 1 with solder or the melting of the solder of already pre-soldered printed circuit boards 1 is accomplished in a splash bath 120, has been schematically illustrated in FIG. 5. Here, the printed circuit board 1 is covered while in a horizontal position with a flux agent 150, pre-heated in a heating station 160, and then further drawn through the splash bath 120 while in a substantially horizontal position. Thereafter, the soldered printed circuit board 1 containing excess molten solder arrives at a heat retaining station 170 which serves to prevent undesired cooling-off of the printed circuit board 1, before such has completely passed through the splash bath 120 and can have the excess molten solder knocked-off of such printed circuit board 1 as will be explained hereinafter. The soldered printed circuit board 1 containing the excess molten solder is then quickly withdrawn from the heat retaining station 170 by means of a gripper device 180 and inserted into a pivotable frame or frame means 140 which is pivoted by 90° about a pivot shaft 141, so that such printed circuit board 1 now is positioned perpendicular to the transport plane.

Figure 4:
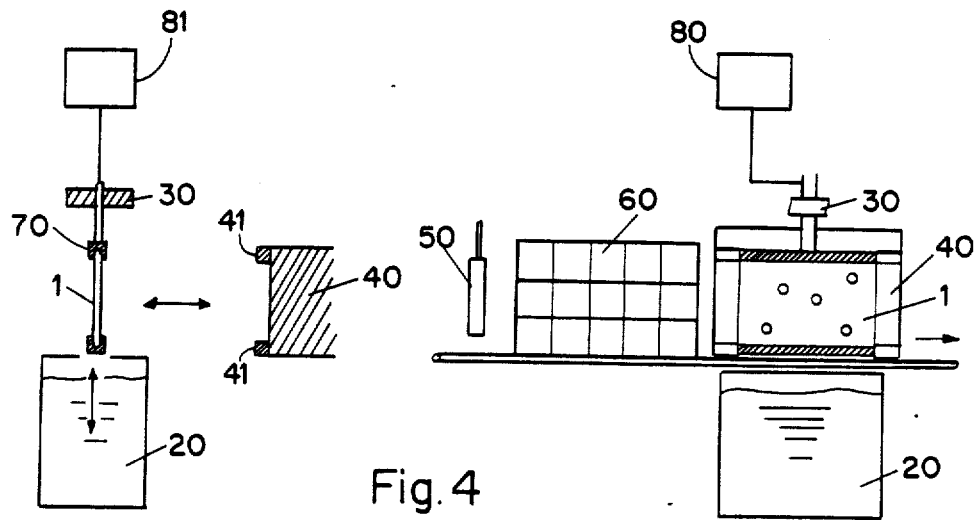
FIG. 4 illustrates a further embodiment of the inventive apparatus.

Just as was the case for the arrangement of FIG. 4, there is thereafter again initially accomplished a knocking-out of the excess molten solder in the direction of the printed circuit board plane, i.e. in a direction substantially perpendicular to the axes of the drill holes in the printed circuit board 1. For this purpose accelerating means act upon the frame or frame means 140 including the printed circuit board 1 in order to accelerate the latter relative to a first impact location in a direction substantially perpendicular to the axes of the drill holes in the printed circuit board 1. In this particular embodiment the accelerating means constitute a plunger 190 or equivalent structure which acts from below on the frame or frame means including the printed circuit board 1 in order to knock-out excess molten solder which flows downwardly along the surface of the printed circuit board 1. Thereafter the frame or frame means 140 including the printed circuit board 1 is operated upon by further accelerating means which accelerate the frame or frame means 140 relative to a further impact member at a further impact location in a second direction which is substantially perpendicular to the first direction of acceleration, i.e. in a direction parallel to the axes of the drill holes in the printed circuit board 1.

In the illustrated embodiment the further impact member and the further impact location constitute the impact member 41 at the impact location 40 described hereinbefore with reference to FIG. 4. As described, the further impact location 40 serves to substantially completely free the printed circuit board 1 of excess molten solder. Also, in this case there is readily possible a multiple knocking-out of the undesired excess molten solder from the printed circuit board 1 as mentioned hereinbefore with reference to FIG. 4 of the drawings.

While there are shown and described present preferred embodiments of the invention, it is to be distinctly understood that the invention is not limited thereto, but may be otherwise variously embodied and practiced within the scope of the following claims. Accordingly,

What we claim is:

1. An apparatus for removing excess molten solder out of drill holes of component-free printed circuit boards, comprising:
    movable frame means;
    receiving means provided for said movable frame means for receiving at least one printed circuit board;
    guide means cooperating with said movable frame means and said receiving means and along which there can be randomly displaced said receiving means containing said at least one printed circuit board;
    means for defining an impact location;
    said printed circuit board being displaceable along said guide means and undergoing an acceleration relative to said impact location;
    said receiving means containing structure for receiving said printed circuit board in a substantially horizontal position;
    said guide means including two substantially parallel vertical guide rails along which there is movable said movable frame means; and
    at least one controllable displacement means for displacing said movable frame means along said guide rails into any random position between a lower boundary position and an upper boundary position and thereafter under the action of said displacement means moving said movable frame means from a predetermined selected random position through a vertical drop along said guide means towards said impact location.

2. The apparatus as defined in claim 1, further comprising:
    control means for the elimination of the action of said displacement means for moving said movable frame means out of a predetermined selected random position through a vertical drop in a guided free fall along said guide means towards said impact location.

3. An apparatus for removing excess molten solder out of drill holes of component-free printed circuit boards, comprising:
    movable frame means;
    receiving means provided for said movable frame means for receiving at least one printed circuit board;
    guide means cooperating with said movable frame means and said receiving means and along which there can be randomly displaced said receiving means containing said at least one printed circuit board;
    means for defining an impact location;
    said printed circuit board being displaceable along said guide means and undergoing an acceleration relative to said impact location;
    a drop region defined beneath said movable frame means; and container means arranged at the drop region of said frame means for receiving solder particles knocked out of the drill holes of the printed circuit board upon impact of the frame means at the impact location.

4. The apparatus as defined in claim 3, wherein:

said receiving means defines a support plane for said at least one printed circuit board; and said container means being connected with said frame means at a predetermined distance below said support plane for the printed circuit board.

5. The apparatus as defined in claim 4, wherein:

said container means has a floor position composed of at least two parts which upon impact of said frame means are downwardly displaced and thus open the floor portion of said container means; and said floor portion of said container means being subjected to the action of spring force which, after standstill of said frame means, causes said at least two parts of the floor portion of said container means to again assume an initial position closing a bottom region of the container means.

6. An apparatus for eliminating excess molten metal from through holes of tinned printed circuit boards, comprising:

receiving means for supporting at least one printed circuit board;

movable frame means for supporting said receiving means;

stop means defining at least one impact location for said movable frame means;

retaining means for retaining said movable frame means in a desired initial location;

said retaining means comprising release means for releasing said movable frame means from said desired initial location;

stationary guide means cooperating with said movable frame means for freely permitting guided displacement of said movable frame means, said receiving means and said at least one printed circuit board supported in said receiving means toward said stop means;

said movable frame means comprising container means for receiving droplets of excess molten metal shaken loose from said at least one printed circuit board by inertial forces upon impact of said movable frame means against said stop means; and said movable frame means being configured to support said receiving means such that said at least one printed circuit board supported in said receiving means is freely situated in spaced relationship to said container means and said container means shields said at least one printed circuit board from air currents.

7. The apparatus as defined in claim 6, wherein:

said retaining means comprises alternate means for retaining said movable frame means in an alternate initial location in addition to said desired initial location; and said alternate initial location being more remote from said stop means than said desired initial location.

8. The apparatus as defined in claim 6, wherein:

said container means comprises a floor member;

said floor member comprising at least one pivotably arranged floor member component; and said movable frame member being provided with spring means for maintaining said at least one pivotably arranged floor member component in a closed position during said guided displacement and for permitting said at least one pivotably arranged floor member component to pivot into an open position under the action of inertial forces upon impact of said movable frame means against said stop means.

9. The apparatus as defined in claim 6, further including:

controllable displacement means for positively effecting said guided displacement of said movable frame means toward said stop means.

* * * * *

UNITED STATES PATENT AND TRADEMARK OFFICE
CERTIFICATE OF CORRECTION

PATENT NO. : 4,703,714

DATED : November 3, 1987

INVENTOR(S) : IMRA BAJKA et al

It is certified that error appears in the above-identified patent and that said Letters Patent is hereby corrected as shown below:

Column 1, line 17, please delete "boares" and insert --bores--

Column 2, line 43, please delete "component-less or base" and insert --bare--

Column 4, line 66, after "substantially" please insert --parallel--

Column 7, line 10, after "appropriately" please insert --controlling--

Column 7, line 11, after "8A" please delete "controlling"

Column 7, line 51, after "and" please delete "such"

Column 8, line 34, please delete "at" and insert --in--

Signed and Sealed this

Seventh Day of June, 1988

Attest:

DONALD J. QUIGG

*Attesting Officer*   *Commissioner of Patents and Trademarks*